Nov. 7, 1961 R. MAURER ET AL 3,008,103

ELECTRIC FILTER

Filed Sept. 10, 1958 2 Sheets-Sheet 1

Inventors
Robert Maurer & Rudolf Sittner
By [signature]
Patent Agent

Nov. 7, 1961 R. MAURER ET AL 3,008,103

ELECTRIC FILTER

Filed Sept. 10, 1958 2 Sheets-Sheet 2

Inventors:
Robert Maurer & Rudolf Sittner
By [signature]
Patent Agent

United States Patent Office 3,008,103
Patented Nov. 7, 1961

3,008,103
ELECTRIC FILTER

Robert Maurer, Ulm (Danube), and Rudolf Sittner, Erbach near Ulm (Danube), Germany, assignors to Telefunken G.m.b.H., Berlin NW., Germany Filed Sept. 10, 1958, Ser. No. 760,165
Claims priority, application Germany Sept. 24, 1957
6 Claims. (Cl. 333—73)

The present invention relates to input stages for ultra-high frequency equipment, particularly, to stages coupled by wide-band filters comprising tuned circuits of half-wave lengths.

It has been known to use tank circuits as oscillating circuits in the field of ultra-high frequency radio transmission. In addition, several circuits of distributed impedances can be combined by suitable couplings to form wide-band filters in the same manner as with lumped circuit components. Depending upon the requirements, the coupling may be direct, capacitive or inductive. In case of ultra-high frequency input stages, in which tuning over the range of frequencies is accomplished by means of variable capacitive members, it is often desirable to use half-wave circuits. However, these circuits are, in effect, shortened by the tube interelectrode capacitance at one end, and by the tuning capacitor at the other end. In case of tunable input stages, a relatively large band width is desirable, but this results in shifting of the voltage nodes in the tank circuits, as these circuits are tuned over their range of frequencies. As a result of this, the amount of energy coupled from one tank circuit into the next tank circuit of the band filter depends upon the tuning condition. This condition becomes worse as the tuning range is increased.

It is an object of the present invention to overcome this disadvantage in the use of half-wave circuits.

It is another object of the invention to provide an input stage to be used with several half-wave circuits which are connected to form a band pass filter inserted between the input tube and the mixer. If greater selectivity is required, the input circuit of the first stage may also be a band filter comprising half-wave circuits for balanced operation, said circuits being tuned by variable capacitors. The connecting elements combining the individual circuits into band filters are arranged and designed in such a manner, that variations in the voltage distribution during the tuning of the tank circuits over a range of frequencies are compensated by the coupling elements over the frequency range.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

Figure 1:
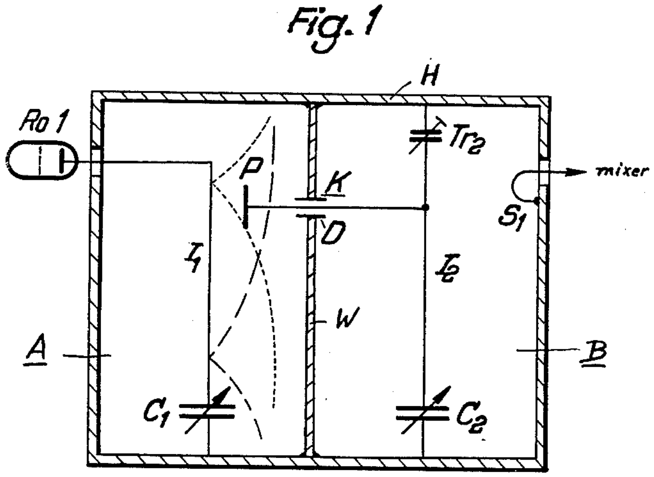
FIGURE 1 illustrates diagrammatically a wide band filter according to this invention.

In the embodiment of FIGURE 1, two tank circuits A and B are combined in a conductive housing H to form a band filter. An input tube $Ro_1$ is coupled to the primary circuit of the band filter in such a manner, that the anode is directly connected with the conductor $I_1$ of the first tank circuit A inside the housing H. The two tank circuits A and B are $\lambda/2$ circuits which are adapted to be tuned by means of variable capacitors $C_1$ or $C_2$ over a selected range of frequencies. A trimmer $Tr_2$ is connected to the capacitor $C_2$ to insure synchronized tuning of the two circuits A and B which are separated by a partition or wall W in the housing H. The two tuned or tank circuits A and B are coupled to form a band filter by means of a coupling element K. This coupling element is connected at a predetermined point along a conductor $I_2$ in the second tank circuit B and extends into the first tank circuit A through an insulating bushing D in the partition W. The coupling element K has a terminal designed as a plate P located opposite the conductor $I_1$ of the first tank circuit A. $S_1$ is a short pick-up loop connecting the output of the band filter to the mixer (not shown).

The circuit arrangement illustrated in FIGURE 1 is a part of an input stage to be used, for example, for the reception of ultra-high frequency radio signals, wherein the tube stage is tunable to the first node. Thus, the $\lambda/2$ circuit is effectively shortened by the capacitance at both ends, i.e., at one end by the tuning capacitor and at the other end by the tube interelectrode capacitance. The input circuit (not shown) of the first tube may be designed as band filter also to obtain greater selectivity. In such case, the input circuit should, likewise, comprise $\lambda/2$ tank circuits for uniform tuning, said circuits being designed and coupled in the same manner as the band filter between input tube and mixer.

A relatively large band width is necessary in case of ultra-high frequency input stages. If the tank circuits A and B are tuned through their frequency range, the voltage node shifts along the conductor $I_1$ of the first tank circuit A. Thus, the coupling element K is exposed to voltages of different magnitudes, depending upon the frequency of the energy.

Voltage curves are indicated in FIGURE 1 for two frequencies, for the purpose of better explanation. The dotted line represents the voltage distribution obtained in case of the frequency at the high end of the range, while the dashed line indicates the voltage distribution obtained in case of the lowest frequency of the range. When prior art coupling elements are used, the energy transmitted to the second circuit B would depend to a great extent on the frequency of the energy and would substantially reduce the band width over with the apparatus could satisfactorily operate.

According to the invention, the coupling elements will be designed in such a manner, that the voltage distribution is maintained constant over the entire frequency range of the apparatus. This is accomplished by arranging the distance between the plate P of the coupling element and the conductor $I_1$ of the circuit A and the length and the diameter of the coupling line K from the conductor $I_2$ of the circuit B to the plate P in such a manner, that the entire coupling arrangement acts as a series circuit having a frequency-dependant conductance value due to the *L/C* ratio, said ratio being selected to compensate the voltage distribution along the conductor $I_1$ of the tank circuit A through the frequency range and to assure a constant band width of the filters.

For a band width of 10 mc. in the frequency range of 470 to 800 mc. as an example the ratio $\sqrt{L/C}$ must be 400Ω.

Figure 2:
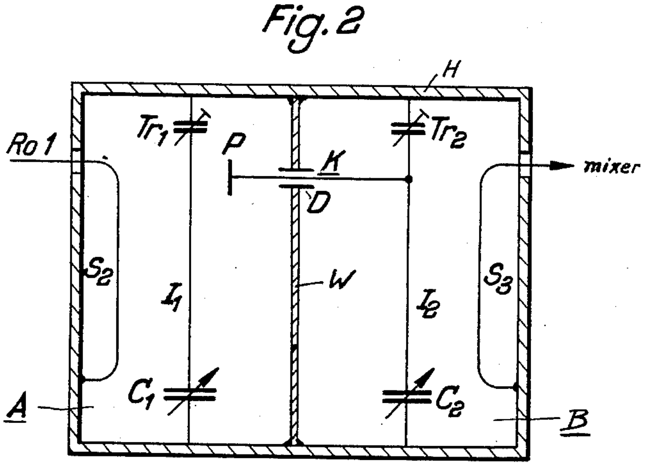
FIGURE 2 shows diagrammatically a modification of the band filter of FIGURE 1.

In the embodiment of FIGURE 2, inductive coupling probes $S_2$ and $S_3$ are provided at the input and output, respectively, of the band pass filter. As already proposed, these probes are arranged in such a manner, that the current peaks and the voltage nodes which shift during tuning are influenced by the surface area of the input probe $S_2$ throughout the frequency range.

In FIGURE 2, the housing H is divided by a partition

W separating two tank or tuned circuits A and B. The elongated conductive coupling probe $S_2$ is arranged in the circuit A parallel to an internal conductor $I_1$ which has a tuning capacitor $C_1$ connected adjacent one end and a trimmer $Tr_1$ connected adjacent its other end. A conductor K having a terminal plate P adjacent and parallel to the conductor $I_1$ passes through an insulating bushing D in the partition W to connect with another internal conductor $I_2$ in the circuit B. The second elongated inductive coupling probe $S_3$ is arranged parallel to the conductor $I_2$ to couple energy from the circuit B to external circuitry (not shown). For tuning purposes, a variable capacitor $C_2$ is connected adjacent one end of conductor $I_2$ and a trimmer $Tr_2$ is connected adjacent its other end.

In addition to these examples, in which a frequency-dependant coupling impedance (series circuit) is used, a constant band width may be obtained in accordance with the invention by means of a capacitive two-point coupling.

In accordance with the invention, such capacitive coupling is provided at two points, whereby one coupling capacitor serves for tuning the circuit, in case of low frequencies to the voltage node at the highest tunable frequency, while the second coupling capacitor serves for tuning the circuit in case of high frequencies to the voltage node at the lowest tunable frequency.

Figure 3:
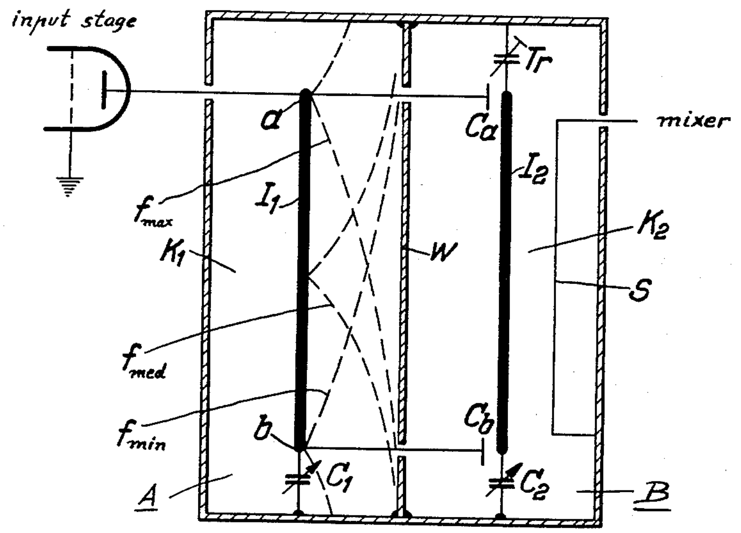
FIGURE 3 illustrates diagrammatically another modification of the band filter of FIGURE 1.

FIGURE 3 shows such embodiment of the invention, wherein two half-wave tank circuits $K_1$ and $K_2$ are coupled to form a band pass filter inserted between the input stage and the mixer (not shown) of an ultra-high frequency tuner. These two tuned or tank circuits $K_1$ and $K_2$ of the band filter are mechanically constructed in such a manner, that they have a common partition or wall W as a screen. $I_1$ and $I_2$ are internal conductors for the two tank circuits, of which the conductor $I_1$ of the primary tank circuit $K_1$ is directly coupled at point $a$ to the anode of the input stage, while the secondary tank circuit $K_2$ of the band filter is connected to the mixer via a coupling loop S. $C_1$ and $C_2$ are the two variable tuning capacitors of the capacitively tunable band filter. A trimmer $Tr$ is provided to ensure synchronized tuning of these two circuits $K_1$ and $K_2$.

The invention is based on the shifting current and voltage distribution of the $\lambda/2$ tank circuits during tuning. As shown in FIGURE 3, the two tank circuits $K_1$ and $K_2$ are capacitively coupled to one another at the points $a$ and $b$, so that a two-point capacitive coupling is provided. The voltage distribution during tuning is indicated in the tank circuit $K_1$ for three different frequencies, in order to explain the operation of the invention. The dashed curves show the voltage for the lowest tunable frequency $f_{min}$, for a medium frequency $f_{med}$, and for the highest tunable frequency $f_{max}$ of the half-wave circuits.

These curves show that the voltage nodes shift along the interior conductor $I_1$ as the circuit is tuned. In case of tuning towards high frequencies, the voltage node travels in the direction towards the terminal of the input tube. This means that, in case of capacitive, inductive or direct coupling, from a definite point on, the internal conductor $I_1$ of the primary tank circuit $K_1$ to the secondary tank circuit $K_2$, the coupling and, thereby, the band width of the band filter is changed, i.e., is decreased in this case. In case of tuning towards low frequencies, as seen from the medium frequency curve, the coupling and, thereby, the band width is increased.

In case of ultra-high frequency tuners with an input stage and a self-oscillating mixing stage, half-wave circuits which can be tuned by variable capacitors are generally used. In order to suppress oscillator voltage transients and to increase the image frequency and adjoining channel safety factors, a band pass filter is usually inserted between input stage and mixing stage. A substantially constant band width over the entire tuning range is required for such a band pass filter, comprising two half-wave circuits, i.e., the coupling of the band filter circuits has to remain constant over the entire tuning range. This result is obtained in accordance with the invention by simultaneously coupling the two tank circuits with one another by capacitors $Ca$ and $Cb$ at the points $a$ and $b$, respectively. The capacitive two-point coupling responds primarily at the point $a$ in accordance with the voltage distribution occurring in case of the low frequency $f_{min}$. The point $a$ coincides with the point of the internal conductor $I_1$ where the highest voltage occurs at the lowest tunable frequency. The coupling capacity $Cb$ primarily responds in case of the highest frequency $f_{max}$. The terminal point $b$ corresponds to the position of the maximum voltage for the highest tuning frequency $f_{max}$ on the internal conductor $I_1$. For a medium frequency $f_{med}$, the coupling is obtained simultaneously by the two coupling capacities $Ca$ and $Cb$. These two coupling capacities $Ca$ and $Cb$ pass through openings in the wall W from the internal conductor $I_1$ to the internal conductor $I_2$ in any suitable manner, such as by the use of insulating bushings.

A constant coupling of the circuits of the band pass filter and, thereby, a constant band width of the filter over the entire tuning range, will be obtained with a capacitive two-point coupling designed in this manner. The coupling of each can be adjusted at the end points or terminals independently from the other. An ultra-high frequency tuner constructed in such a manner has great advantages in case of mass production, due to the two-point coupling adjustments.

Two or more coupling capacitors may be provided in accordance with the invention in such a manner, that a desired coupling curve is obtained, which curve is a function of tuned frequency.

We claim:

1. A wide-band filter for high frequency electrical energy, said filter comprising a first tuned tank circuit equivalent in impedance, at the mean frequency of the band, to a half-wave length transmission line, said first tank circuit comprising a first internal conductor and a first tuning capacitor connected between said first internal conductor and the tank for tuning said first tank circuit throughout a band width at which the voltage distribution varies substantially along said first internal conductor; a second tuned tank circuit equivalent in impedance to a half-wave length transmission line, said second tank circuit comprising a second internal conductor and a second tuning capacitor connected between said second internal conductor and the second tank; and fixed means for coupling electrical energy between said first circuit and said second circuit, said means comprising a first coupling conductor having one end connected to one end of said first internal conductor and having at its other end a plate in operative relation to the adjacent end of said second internal conductor, and a second coupling conductor connected at one end to the other end of said first internal conductor and having a plate at its other end in operative relation to the other end of said second internal conductor, said coupling conductors and said plates being so dimensioned as to maintain the coupling between said tank circuits substantially constant irrespective of the frequency to which the filter is tuned.

2. A band-pass filter for passing a range of high frequencies from a stage having an output electrode, comprising first and second adjacent tank circuits, respectively having first and second inner conductors and first and second tuning capacitors connected from the conductors to the tank, and tuning the tank circuits respectively to comprise half-wave-length transmission lines at the mean frequency of said range with the entire band width throughout which said first tuning capacitor tunes said first tank circuit being such that the voltage distribution of said first tank circuit varies substantially along said first inner conductor; input coupling means for coupling high-frequency energy from said electrode into the first tank circuit; output coupling means disposed in the second tank circuit; and fixed means for mutually coupling the tank circuits through an opening therebetween, comprising at least one coupling conductor extending through said opening and connected at one end at right angles to one inner conductor at a selected point, and a plate of a selected area connected to the other end of each coupling conductor and located a selected distance from the other inner conductor, the said area and distance, and the length and diameter of the coupling conductor being selected such that the inductive and capacitive components of the coupling means compensate for the degree of change in coupling between the tank circuits caused by shifting of the voltage nodes along the inner conductors as the frequency is varied within the pass band, whereby the coupling between said tank circuits is maintained substantially constant irrespective of the frequency to which the filter is tuned.

3. In a filter as set forth in claim 2, said means for coupling said output electrode to the first tank circuit comprising a direct connection to the first inner conductor through the wall of the first tank circuit.

4. In a filter as set forth in claim 2, said input and output coupling means each comprising a loop in the associated tank and disposed longitudinally thereof coextensive with the positions along the inner conductor at which voltage nodes occur during passing of frequencies within said range.

5. In a filter as set forth in claim 2, said mutual coupling means comprising two coupling conductors and plates extending through two spaced openings between said tanks and connected to symmetrically spaced selected points of one inner conductor, one mutual coupling means compensating the nodal positional change at the highest frequency within said range and the mutual coupling means at the lowest frequency within said range.

6. In a filter as set forth in claim 2, trimmer condenser means in at least one tank and connected between the inner conductor and the end of the tank opposite from the end at which the tuning capacitor is located.

References Cited in the file of this patent

UNITED STATES PATENTS

| | | |
|---|---|---|
| 2,428,272 | Evans | Sept. 30, 1947 |
| 2,513,761 | Tyson | July 4, 1950 |
| 2,753,530 | Horvath | July 3, 1956 |
| 2,795,699 | Balash | June 11, 1957 |
| 2,798,206 | Baroch | July 2, 1957 |
| 2,903,659 | Lombardi | Sept. 8, 1959 |